United States Patent
Zhang

(10) Patent No.: US 6,235,126 B1
(45) Date of Patent: May 22, 2001

(54) CLEANING SYSTEM FOR VERY SMALL SEMICONDUCTOR SPHERICAL-SHAPED OBJECTS

(75) Inventor: Shenchu Zhang, Dallas, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/243,157

(22) Filed: Feb. 2, 1999

(51) Int. Cl.[7] ....................................... B08B 1/02
(52) U.S. Cl. .................. 134/32; 134/42; 134/157
(58) Field of Search ....................... 438/745, 753; 134/2, 32, 42, 157; 15/103.5, 21.2; 156/345

(56) References Cited

U.S. PATENT DOCUMENTS

| | | |
|---|---|---|
| 4,899,413 | 2/1990 | Trobiani . |
| 4,958,396 | 9/1990 | Butler et al. . |
| 4,974,763 | 12/1990 | Widrig . |
| 4,984,629 | 1/1991 | Voith et al. . |
| 5,004,239 | 4/1991 | Wettstein . |
| 5,010,950 | 4/1991 | Voith . |
| 5,056,946 | 10/1991 | Larkin . |
| 5,361,440 | 11/1994 | Buchbinder et al. . |
| 5,462,639 | 10/1995 | Matthews et al. ............ 156/662.1 |
| 5,519,910 | 5/1996 | Messina . |
| 5,546,629 | 8/1996 | Shim . |
| 5,669,096 | 9/1997 | Worsham . |
| 5,673,918 | 10/1997 | Bigari . |
| 5,680,665 | 10/1997 | Anson et al. . |

FOREIGN PATENT DOCUMENTS 2-119241  10/1988  (JP) .

*Primary Examiner*—Thi Dang
(74) *Attorney, Agent, or Firm*—Haynes and Boone LLP

(57) ABSTRACT

A system and method for cleaning very small spherical shaped semiconductor devices is disclosed. The system includes an enclosure for housing a pair of rollers. The enclosure also includes a fluid inlet for receiving a cleaning agent and a product inlet for receiving the spherical shaped semiconductor device. A motor rotates one or both of the rollers. In operation, the spherical shaped semiconductor device and the cleaning agent are provided into the enclosure. The device passes to the pair of rollers and is cleaned by the cleaning agent and the rotating rollers. Once cleaned, the spherical shaped device and cleaning agent pass into a separator and the device is fully cleaned.

13 Claims, 4 Drawing Sheets

CLEANING SYSTEM FOR VERY SMALL SEMICONDUCTOR SPHERICAL-SHAPED OBJECTS

BACKGROUND OF THE INVENTION

The invention relates generally to a cleaning systems for spherical-shaped objects, and more particularly, to a method and system for handling and cleaning very small spherical-shaped objects suitable for use in the manufacture of spherical-shaped semiconductor integrated circuits.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several steps including making rod-form high purity polycrystalline semiconductor material, manufacturing a large single crystalline ingot from melted high purity polycrystalline semiconductor material in a quartz crucible, cutting the ingot into pieces (wafers), and lapping, polishing and cleaning wafers. Device fabrication processes thereafter include several high-temperature processes such as oxidation, doping, and diffusion, as well as chemical processes such as wet etching, chemical vapor deposition ("CVD"), chemical mechanical polishing ("CMP"), and photolithography process.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, because the wafers are round and the completed chips are rectangular, the peripheral portion of each wafer cannot be used.

Therefore, due to these and various other problems, only a few companies in the world today can successfully manufacture conventional flat chips. Furthermore, the chips must bear a high price to cover the costs of manufacturing, as well as the return on initial capital and investment.

In co-pending U.S. Pat. No. 5,955,776 filed on May 16, 1997, assigned to the same assignee as the present application and hereby incorporated by reference as if reproduced in its entirety, a method and system for manufacturing spherical-shaped semiconductor integrated circuits is disclosed. As disclosed in the aforementioned patent application, the manufacturing process by which a spherical-shaped semiconductor integrated circuit device is produced may include a variety of processing steps.

Complicating the manufacturing process for spherical-shaped semiconductor integrated circuit devices are the special handling requirements which must be afforded the devices during their manufacture. Unlike conventional integrated circuits formed on flat surface semiconductor wafers, the integrated circuit may consume the entire surface area of the spherical-shaped semiconductor device. Also, unlike conventional integrated circuits which may be grasped along bottom or side surfaces thereof, grasping or otherwise contacting spherical-shaped semiconductor integrated circuit devices during the manufacturing process may result in significant damage. Furthermore, many of the processing techniques used to manufacture conventional integrated circuits are unsuitable for use in the manufacture of spherical-shaped semiconductor integrated circuit devices.

In particular, cleaning a spherical-shaped semiconductor substrate or integrated circuit device can not be performed in the same way as cleaning a relatively flat semiconductor wafer. Unlike conventional semiconductor wafers that can be placed in a container and sprayed or immersed with cleaning agent, the spherical-shaped semiconductor integrated circuit devices must be cleaned on all surfaces, with special care in the touching and handling of the surfaces. Also, unlike devices for cleaning other spherical shaped devices such as ball bearings, spherical-shaped semiconductor integrated circuits are extremely small, typically about 1 millimeter (mm) in diameter, and can be damaged very easily. The cleaning devices for ball bearings cannot be simply scaled down to this degree. Also, the spherical-shape semiconductor integrated circuits are extremely susceptible to scratches and other type of surface damage.

Therefore, the difficulties associated with the handling and cleaning of spherical-shaped semiconductor devices during the manufacturing process remains an obstacle to the development of such devices. Thus, there remains a need for a system and method capable of cleaning very small spherical-shaped semiconductor devices without damaging their outer surface.

SUMMARY OF THE INVENTION

In one embodiment, the present invention provides a system and method for cleaning very small spherical shaped semiconductor devices. The system includes an enclosure for housing a pair of rollers. The enclosure also includes a fluid inlet for receiving a cleaning agent and a product inlet for receiving the spherical shaped semiconductor device. A motor rotates one or both of the rollers.

In operation, the spherical shaped semiconductor device and the cleaning agent are provided into the enclosure. The device passes to the pair of rollers and is cleaned by the cleaning agent and the rotating rollers. Once cleaned, the spherical shaped device and cleaning agent pass into a separator and the device is fully cleaned.

In another embodiment, the system can sequentially clean a plurality of spherical shaped semiconductor devices. The system includes an enclosure for housing two pairs of rollers. The enclosure also includes the fluid inlet for receiving the cleaning agent and the product inlet for receiving the sequence of spherical shaped semiconductor devices. A motor rotates one or both of the rollers of each pair so that in a first direction of rotation, the rollers cause a spherical shaped semiconductor device to pass through the pair of rollers, and in the opposite direction the device stays inside or above the pair of rollers.

In operation, a first spherical shaped semiconductor device is provided to the first pair of rollers. The first pair of rollers are rotating so that the first spherical shaped semiconductor device stays in the first pair of rollers. The first pair of rollers then rotates in the opposite direction so that the first spherical shaped semiconductor device passes to the second pair of rollers.

In some embodiments, after the first spherical shaped semiconductor device is passed to the second pair of rollers, the first pair of rollers changes rotational direction again. In this way, the first pair of rollers can receive and keep another spherical shaped semiconductor device.

As a result, the system provides an efficient means for handling and cleaning spherical-shaped semiconductor devices during the manufacturing process. The system is capable of cleaning very small spherical-shaped devices without damaging their outer surface and is operable to support a "pipeline" production process.

DESCRIPTION OF THE EMBODIMENTS

Figure 1:
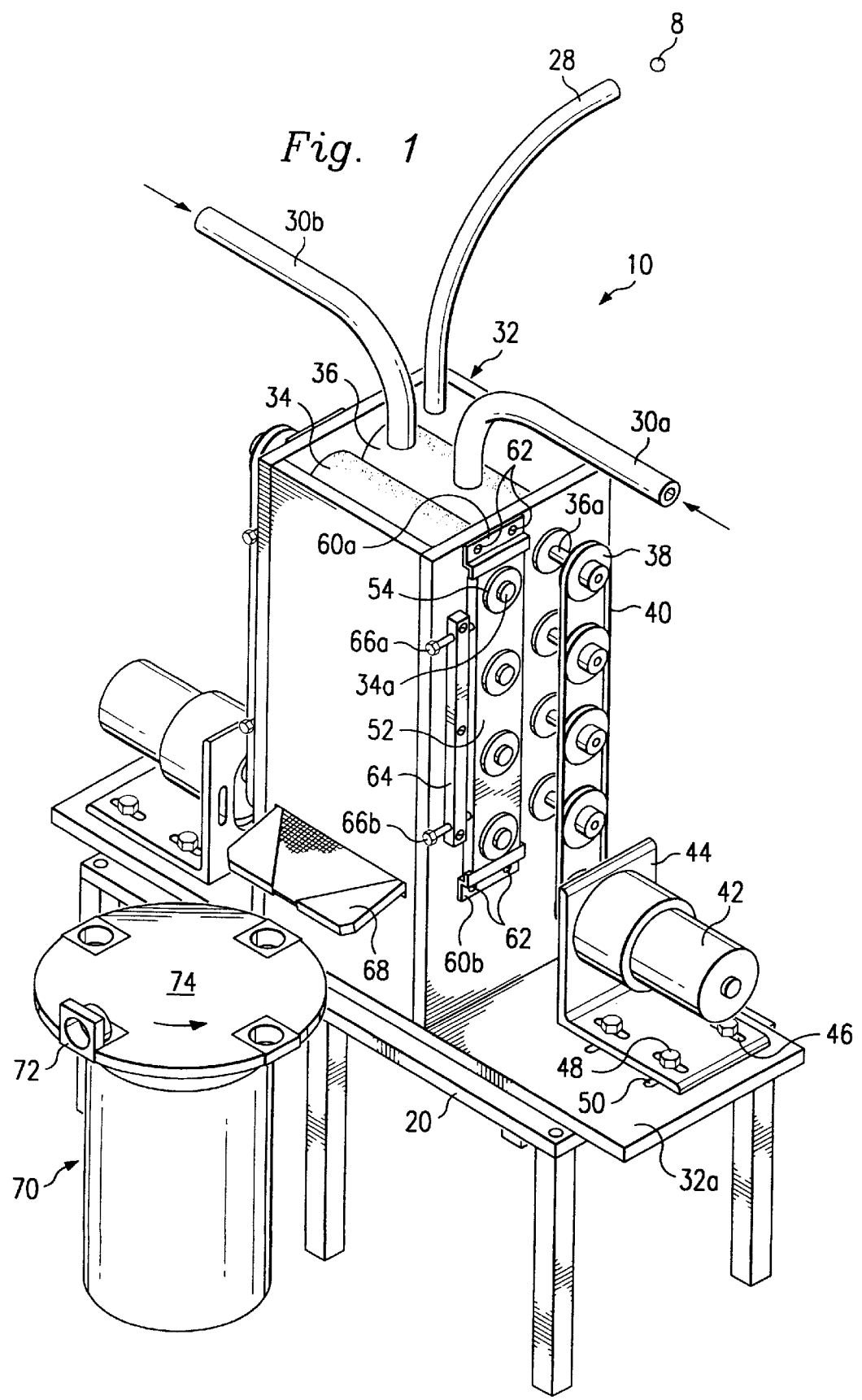
FIG. 1 illustrates a cleaning system for cleaning very small spherical shaped semiconductor devices according to one embodiment of the present invention.

Referring to FIG. 1, the reference numeral 8 refers, in general, to a very small spherical shaped semiconductor device (hereinafter "sphere"). The sphere 8 is one that may, for example, be produced according to presently incorporated U.S. Pat. No. 5,955,776. In the present example, the sphere 8 is about 1 mm in diameter and may include a plurality of circuit components on its outer surface. The present invention may be used while processing the circuit components onto the sphere 8, so in some instances there may be no actual circuit components (such as single crystal silicon substrates ready for fabrication), while in other instances there may be one or more circuit components covering a portion of the sphere's outer surface.

The reference numeral 10 designates, in general, a system for polishing, and/or preparing very small three dimensional devices, such as the sphere 8. The cleaning system 10 includes a base 20 positioned below a device inlet 28, fluid inlets 30a and 30b, and a roller unit 32 with wings 32a. The base 20 functions to support the roller unit 32 during operation and for assembly and disassembly of the roller unit 32, all of which will be discussed in further detail below.

Cleaning agents such as de-ionized water (not shown) are carried via the fluid inlets 30a and 30b to the roller unit 32 in the direction indicated by the arrows. Additionally, multiple spheres 8 may be carried to the roller unit 32 via the device inlet 28. The spheres 8 and cleaning agents enter the roller unit 32 and pass, under the force of gravity, from the top to the bottom of the roller unit 32. It will be apparent to those skilled in the art that the spheres and agents could be carried to the roller unit 32 through the inlets 28 and 30a–30b, respectively, using pressure in conjunction with gravitational forces. The roller unit 32 has a plurality of front rollers 34 and a plurality of rear rollers 36, each rotating about central rods 34a and 36a, respectively.

The rollers 34, 36 are made of a soft, non-abrasive and absorbent material. For the sake of example, the rollers 34, 36 may be made of polyvinyl alcohol from the Rippey Corporation of El Dorado Hills, Calif. Thus, as fluid enters the roller unit 32 from the fluid inlets 30a and 30b, the fluid is partially absorbed by the rollers 34 and 36. A gearing wheel 38 is secured to one end of each of the central rods 34a and 36a. For illustrative purposes, only the operation of the rollers 36 is discussed below. However, the same setup and operation can be utilized for and applies to the operation of the rollers 34.

In a preferred embodiment, the gearing wheels 38, which are secured to the central rods 36a, are vertically aligned. It will be apparent to those skilled in the art that there are a variety of means that can be utilized to secure the gearing wheel 38 to the central rod 36a. For example, the gearing wheel 38 can be secured to the rod 36a by welding, reverse tapped screwing, unipositional co-axial alignment similar to the engagement of the gearing wheel onto a cam-shaft of a typical motor, tension engagement, and snap-locking technologies. With the gearing wheel 38 engaging the central rod 36a, a drive belt 40 engages and drives the gearing wheels 38. A motor 42 drives the drive belt 40. The motor 42 is held in place by a mounting bracket 44 that is secured to the wings 32a. The bracket 44 has a plurality of slots 46 for receiving mounting bolts 48. The slots 46 are positioned in the mounting bracket to align with slots 50 of the wing 32. Accordingly, the position of the motor relative to the gearing wheels 38 can be adjusted to ensure proper alignment and tension. For example, the distance from the end of the motor 42 to the lowest gearing wheel 38 can be altered. Furthermore, the distance separating the central axis of the motor 42 and the central axis of the central rod 36a can be adjusted for proper alignment.

The opposite ends of each central rod 36a are secured in the same way that the opposite ends of the central rods 34a are secured and discussed below. For clarity, the discussion is limited to one of the central rods 34a. One end of the central rod 34a is secured to the gearing wheel 38, as discussed above. The other end of the central rod 34a passes through a bearing case 52 and is held in place by a bearing assembly 54. The bearing case 52 is held in place at the top and bottom end by bearing case retaining rails 60a and 60b, respectively. The retaining rails 60a and 60b secure the bearing case in place. An adjustment bracket 64 receives adjustment screws 66a and 66b that can adjust the position of the roller 34 relative to the rollers 36. Near the bottom of the cleaning system 10 is a separator 68, discussed in greater detail below.

Figure 2:
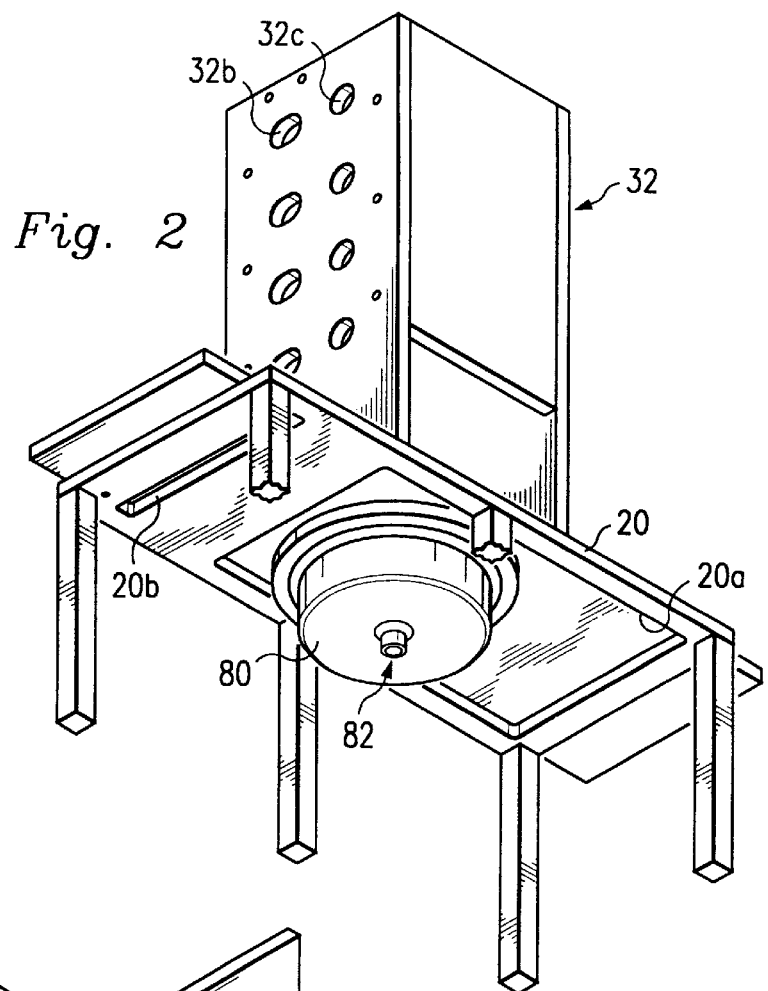
FIG. 2 is a bottom view of the cleaning system of FIG. 1.

Referring to FIG. 2, located below the system 10 is a collecting tank 80 for catching the cleaning agent. The collecting tank 80 has a spout 82 that can be selectively opened to empty the contents of the tank. Alternatively, the spout can be left open during operation to allow the cleaning agents to continually pass into a drain (not shown).

Figure 3:
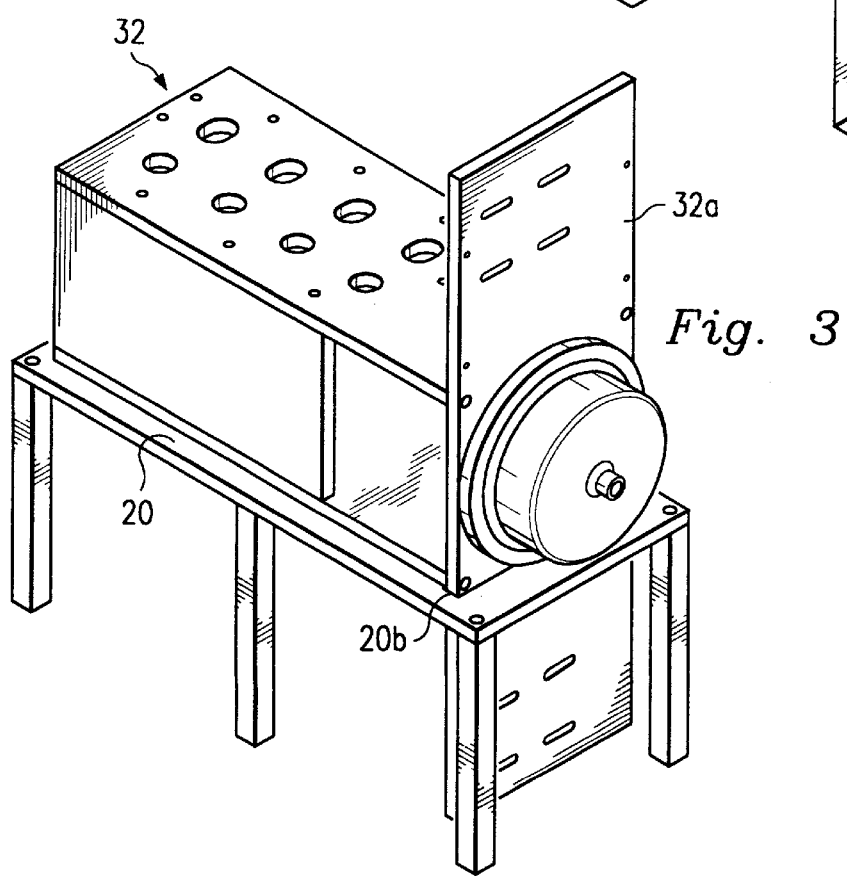
FIG. 3 is a view of the cleaning system of FIG. 1 while it is in an assembly or maintenance state.

Referring to FIG. 3, in addition to being used to provide support to the system 10 during its operation, the table 20 can also be used to provide support to the system 10 during maintenance or assembly operations. By placing the wing 32a through slot 20b located in the table 20, the system 10 can be easy assembled, disassembled and maintained.

Figure 4:
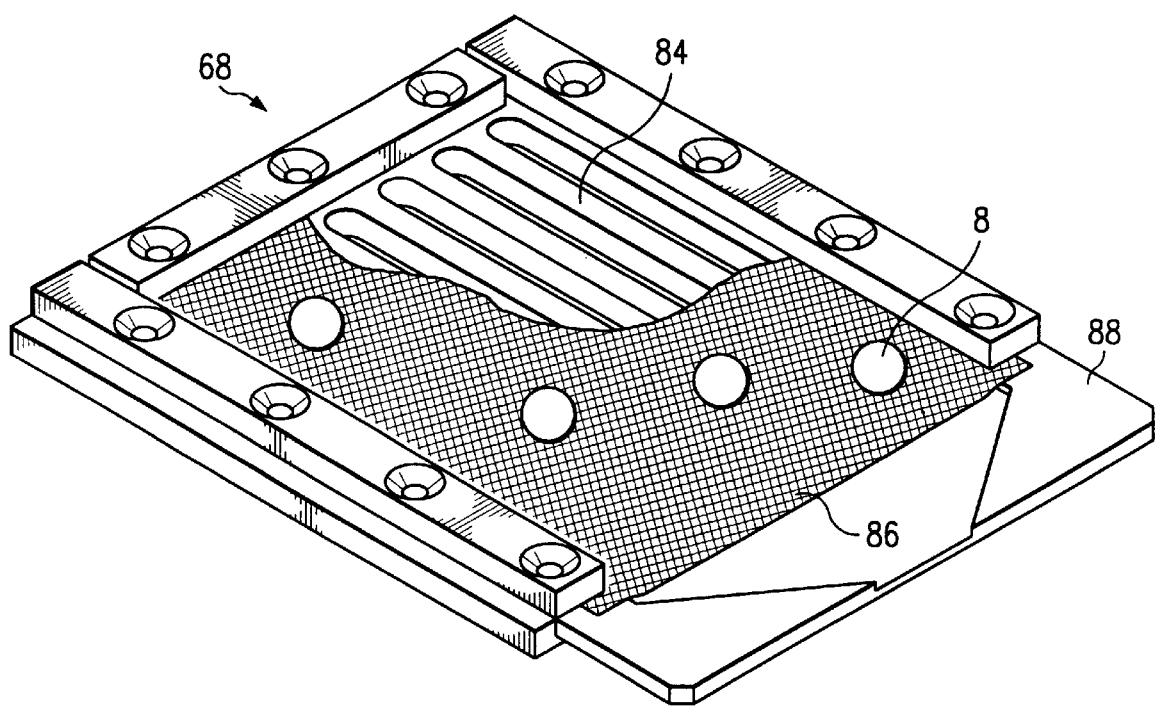
FIG. 4 is a detailed view of a separator used in the cleaning system of FIG. 1.

Referring to FIG. 4, the separator 68 includes a plurality of spaced bars 84, a screen 86, and an exit chute 88. The screen 86 is a soft net-like sheet with openings that are smaller in size than the diameter of the spheres 8. The bars 84 are located underneath the screen 86 to support the screen while spheres and cleaning agents fall thereon. In this way, cleaning agents can fall through the screen 86 and the bars 84 into the collecting tank 80 while the spheres 8 are retained by the screen 86 and directed towards the exit chute 88.

Referring to FIGS. 1–4, in operation, the spheres 8 are delivered to the cleaning system 10 via the device inlet 28. The spheres are then dropped, from the device inlet 28, into the system 10 at the rollers 34 and 36. In one embodiment, the rollers 34, 36 are frictionally fit, pressing against each other. In other embodiments, the rollers 34, 36 are positioned in close proximity so that the distance separating adjacent rollers is less than the diameter of the sphere. The separation of the rollers can be adjusted using the adjusting screws 66a and 66b so that some or all of the adjacent rollers can actually be pressed against each other. At the same time, cleaning agents are delivered to the system 10 via the inlets 30a and 30b.

Figure 5A:
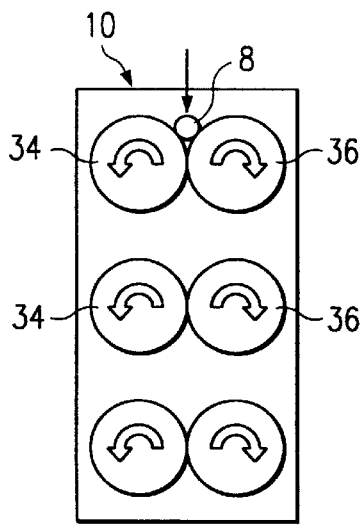
FIGS. 5a–5f illustrate a progression of operation for one embodiment of the cleaning system of FIG. 1 while cleaning a very small spherical shaped semiconductor device.
Figure 5B:
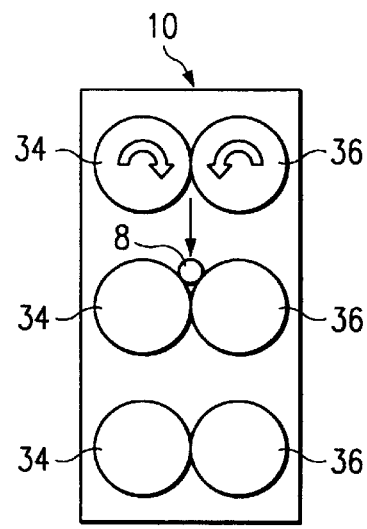
Figure 5C:
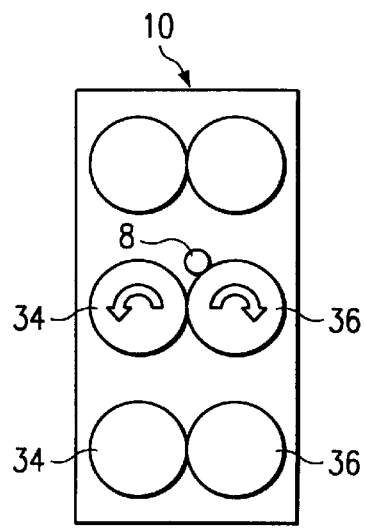

Referring also to FIGS. 5a–5f, the sphere 8 can either "stay" or "go" with respect to the rotation of the rollers 34, 36. For example, FIG. 5a illustrates the sphere 10 being dropped between the uppermost set of rollers 34, 36. The rotation of the rods in FIG. 5a, as indicated by the arrows, makes the sphere 8 stay in the upper set of rollers. However, as soon as the rollers 34, 36 change direction, such as is shown in FIG. 5b, the sphere 8 goes (or drops) to the next set of rollers. The rotational direction of the rollers 34, 36 is quickly changed again, as indicated by the arrows in FIG. 5c, so that the sphere 8 now stays in the middle set of rollers.

Figure 5D:
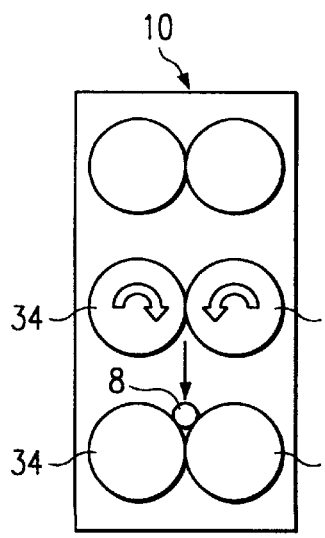
Figure 5E:
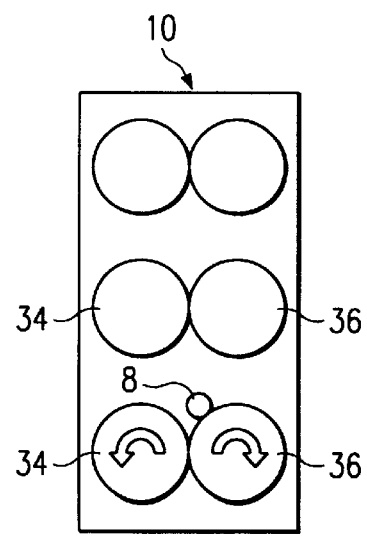
Figure 5F:
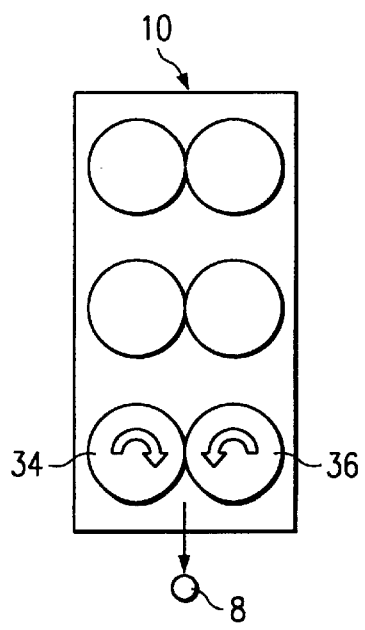

The above process of "stay" and "go" can repeat continually as the sphere 8 is cleaned by subsequent sets of rollers, such as is shown in FIGS. 5d–5e, until it is discarded from the system 10, as shown in FIG. 5f. Alternatively, the sphere 8 may instantly go all the way through the system of rollers by maintaining the roller direction described in FIGS. 5b, 5d, and 5f. Also, multiple spheres 8 can be fed through the system 10 and separated by sequential pairs of rollers.

Referring again to FIGS. 1–4, the spheres 8, along with the cleaning agents, travel through system 10 and are separated by the separator 68. The separator 68 is positioned at an angle, so that the cleaning agents fall through the screen 86 while the spheres 8 roll down the exit chute 88 toward a receiver system 70. In one embodiment, the receiver system includes a device receiver 72 mounted in a rotating plate 74 for receiving the spheres. As the device receiver 72 moves to the opposite side relative to the receiving location, the device receiver is flipped upwards, to eject the sphere to a next process (not shown).

Thus, there has been described and illustrated herein, a method and system for cleaning spherical-shaped objects. It should be clearly understood, however, that various modifications, changes and substitutions are intended in the foregoing disclosure and in some instances some features of the invention will be employed without a corresponding use of other features. For example, the rollers 34 may include gearing wheels to engage gearing wheels on rollers 36. As a result, only one motor is required. Alternatively, the rollers 34 may frictionally drive the rollers 36. Furthermore, some embodiments may only use a single pair of rollers 34, 36. Accordingly, it is appropriate that the appended claims be construed broadly and in a manner consistent with the scope of the invention.

What is claimed is:

1. A system for cleaning a spherical shaped semiconductor device comprising:

an enclosure;

a pair of rollers located inside the enclosure;

a fluid inlet for providing a cleaning agent into the enclosure;

a product inlet for providing the spherical shaped semiconductor device into the enclosure and to the pair of rollers;

means for rotating one of the pair of rollers; and a separator for separating the spherical shaped semiconductor device from the cleaning agent;

whereby the spherical shaped semiconductor device and the cleaning agent are provided to the pair of rollers, the spherical shaped semiconductor device is cleaned by the cleaning agent and the pair of rollers, and the spherical shaped device and cleaning agent are separated by the separator after cleaning.

2. The system of claim 1 further comprising:

a second pair of rollers;

whereby the spherical shaped semiconductor device is further cleaned by the cleaning agent and the second pair of rollers.

3. The system of claim 1 further comprising:

means for rotating the other roller.

4. The system of claim 1 where in the rollers are frictionally fit.

5. The system of claim 1 wherein the rollers are sized to accommodate a spherical shaped semiconductor device that is less than 5 millimeters in diameter.

6. A system for cleaning a plurality of spherical shaped semiconductor devices comprising:

an enclosure;

first and second pairs of rollers located inside the enclosure;

means for providing a cleaning agent to the first pair of rollers;

means for sequentially providing the spherical shaped semiconductor device to the first pair of rollers; and means for rotating the first and second pairs of rollers in a first and second direction, wherein the first direction of rotation causes a spherical shaped semiconductor device to pass through the pair of rollers and the second direction is opposite to the first rotation;

wherein a first spherical shaped semiconductor device is provided to the first pair of rollers rotating in the second direction, the first pair of rollers then rotates in the first direction so that the first spherical shaped semiconductor device is passed to the second pair of rollers.

7. The system of claim 6 wherein the means for rotating is also for reversing the rotation of the first pair of rollers after the first spherical shaped semiconductor device is passed to the second pair of rollers, for receiving another spherical shaped semiconductor device.

8. The system of claim 6 wherein the means for rotation is also for rotating the second pair of rollers in the second direction after the first spherical shaped semiconductor device is passed to the second pair of rollers.

9. The system of claim 6 further comprising:

an exit chute for receiving the spherical shaped semiconductor devices from the second pair of rollers;

wherein, after the first spherical shaped semiconductor device is passed to the second pair of rollers, the second pair of rollers rotates in the first direction to pass the first spherical shaped semiconductor device to the exit chute.

10. The system of claim 9 further comprising:

means for separating the spherical shaped semiconductor devices from the cleaning agent before the spherical shaped semiconductor devices pass to the exit chute.

11. A method for cleaning a spherical shaped semiconductor device having at least part of an integrated circuit imposed thereon, the method comprising the steps of:

rotating a pair of frictionally fit rollers;

providing a cleaning agent to the pair of rollers;

providing the spherical shaped semiconductor device to the pair of rollers; and separating the spherical shaped semiconductor device from the cleaning agent;

wherein the spherical shaped semiconductor device is cleaned by the cleaning agent and the pair of rollers, and the spherical shaped device and cleaning agent are separated by the separator after cleaning.

12. The method of claim 10 further comprising:

rotating a second pair of rollers;

whereby the spherical shaped semiconductor device is further cleaned by the cleaning agent and the second pair of rollers.

13. The method of claim 10 wherein the spherical shaped semiconductor device is less than 5 millimeters in diameter.

* * * * *